(12) United States Patent
Loibl

(10) Patent No.: US 7,045,718 B2+
(45) Date of Patent: May 16, 2006

(54) ARRANGEMENT CONSISTING OF A CIRCUIT CARRIER AND A PRINTED CIRCUIT BOARD OR A PRINTED CIRCUIT BOARD ASSEMBLY

(75) Inventor: Josef Loibl, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 186 days.

(21) Appl. No.: 10/441,520

(22) Filed: May 20, 2003

(65) Prior Publication Data

US 2003/0202333 A1    Oct. 30, 2003

Related U.S. Application Data

(63) Continuation of application No. PCT/DE01/04314, filed on Nov. 15, 2001.

(30) Foreign Application Priority Data

Nov. 20, 2000   (DE) ................................ 100 57 494

(51) Int. Cl.
*H05K 1/11* (2006.01)
*H01R 12/04* (2006.01)

(52) U.S. Cl. .................... 174/261; 174/260; 257/784
(58) Field of Classification Search ............... 174/261, 174/250, 260, 262, 254; 361/760, 784, 803; 439/55, 65, 67; 257/784, 778, 783
See application file for complete search history.

(56) References Cited

U.S. PATENT DOCUMENTS

| 5,168,430 A | 12/1992 | Nitsch et al. ............... 361/398 |
| 5,243,496 A * | 9/1993 | Mermet-Guyennet ....... 361/748 |
| 5,325,268 A * | 6/1994 | Nachnani et al. ........... 361/767 |
| 5,399,904 A * | 3/1995 | Kozono ...................... 257/666 |
| 5,488,256 A | 1/1996 | Tsunoda ..................... 257/723 |
| 5,502,278 A | 3/1996 | Mabboux et al. .......... 174/52.4 |
| 5,686,699 A | 11/1997 | Chu et al. .................. 174/52.4 |
| 5,735,697 A * | 4/1998 | Muzslay ...................... 439/83 |
| 6,018,463 A | 1/2000 | Winslow et al. ............ 361/803 |
| 6,429,536 B1 * | 8/2002 | Liu et al. .................... 257/786 |

FOREIGN PATENT DOCUMENTS

| DE | 195 22 173 C1 | 10/1996 |
| DE | 199 61 116 A1 | 7/2001 |
| WO | WO98/44593 | 10/1998 |

\* cited by examiner

*Primary Examiner*—Kamand Cuneo
*Assistant Examiner*—Ishwar (I. B). Patel
(74) *Attorney, Agent, or Firm*—Baker Botts L.L.P.

(57) ABSTRACT

A printed circuit board with a circuit carrier zone, in which a circuit carrier (S) is located is disclosed. Conductor strips (LE1, LE2) of the printed circuit board (L) are directed towards a guide zone (F) of the printed circuit board (L). Auxiliary conductor strips (H1, H2) are located in the guide zone (F), said strips running substantially parallel to the outline of the circuit carrier zone. First contact sections of the auxiliary conductor strips (H1, H2) are connected to the ends of the conductor strips (L1, L2) that lie in front of the guide zone (F), by bonding links (B) that do not intersect. Second contact sections of the auxiliary conductor strips (H1, H2) are connected to the contact pads (K), by bonding links (B) that do not intersect.

14 Claims, 2 Drawing Sheets

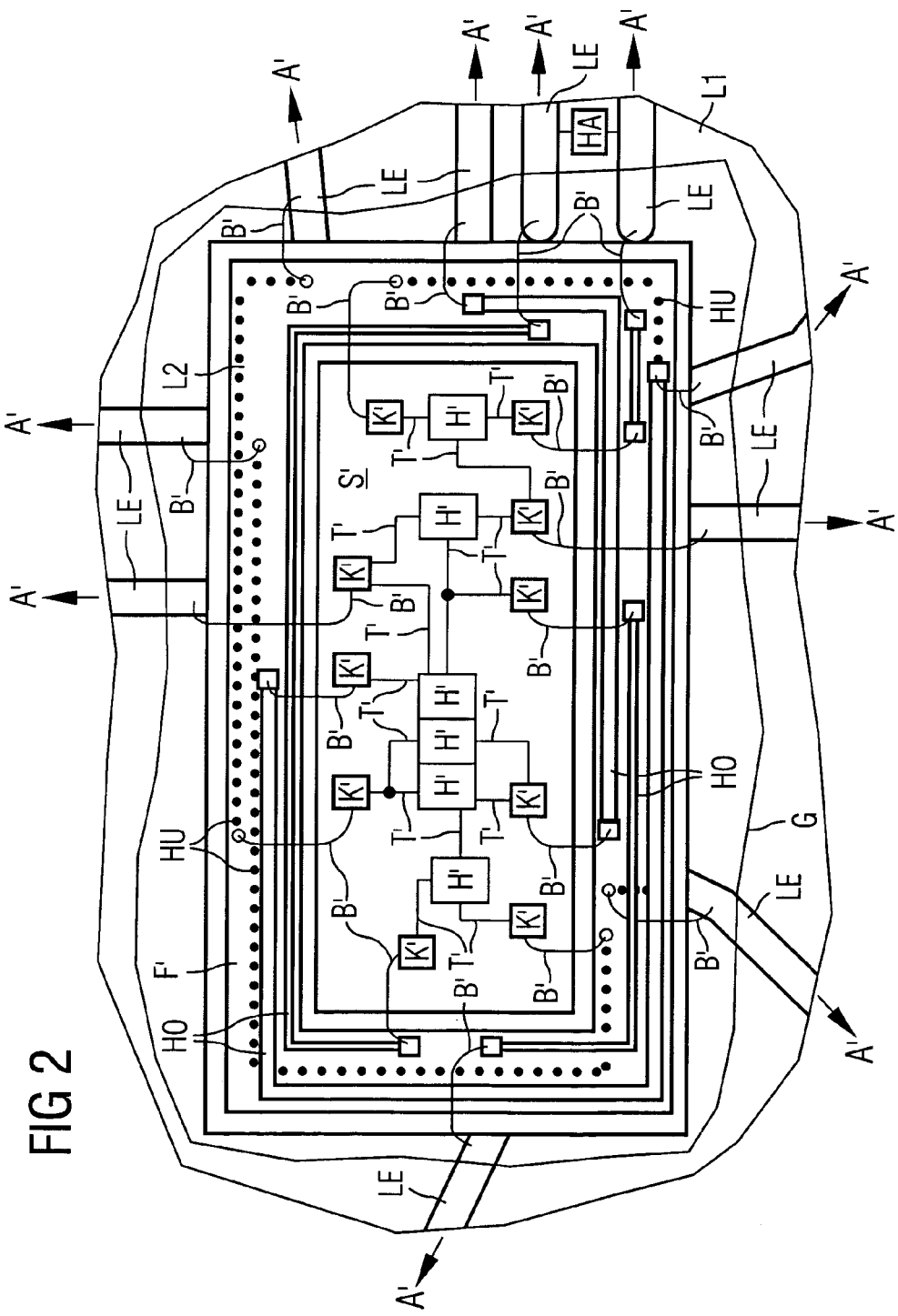

ARRANGEMENT CONSISTING OF A CIRCUIT CARRIER AND A PRINTED CIRCUIT BOARD OR A PRINTED CIRCUIT BOARD ASSEMBLY

CROSS REFERENCE TO RELATED APPLICATION

This application is a continuation of copending International Application No. PCT/DE01/04314 filed Nov. 15, 2001, which designates the United States, and claims priority to German application number 10057494.7 filed Nov. 20. 2000.

BACKGROUND OF THE INVENTION

The invention relates to an arrangement consisting of a circuit carrier and a printed circuit board or a printed circuit board assembly. The invention further relates to a printed circuit board and a printed circuit board assembly for such an arrangement. The invention also relates to a method for manufacturing such an arrangement for equipment such as an automatic transmission system, an engine control unit or a brake system for motorized vehicles.

With automatic transmission systems for motorized vehicles the control electronics and associated sensors are increasingly being integrated in the transmission system. There are similar demands placed on a "local electronics system" in the case, for example, of engine and brake controls. Flexible printed circuit boards, so-called flexible foils, are regularly employed in what are called mechatronic control devices to distribute electrical signals and power. The printed circuit boards in particular have conductor strips that connect terminals of the relevant device to contact pads of a circuit carrier. A drive circuit, for instance, is located on the circuit carrier. Although the layout of the drive circuit and of the contact pads on the circuit carrier is adapted to the arrangement of the terminals of the device, conductor strips may need floating intersections or routing.

A control circuit that is hermetically sealed against oil is familiar from patent application WO 98/44593. A flexible printed circuit board is directed hermetically through a casing of the control circuit and, via a bond, is electrically contacted with a circuit carrier of the control circuit in an overlap zone.

SUMMARY OF THE INVENTION

The object of the invention is to specify an arrangement comprising a circuit carrier and a printed circuit board or a printed circuit board assembly that can be manufactured more simply and economically compared to the state of the art. The object of the invention is further to specify a printed circuit board, a printed circuit board assembly, and a method for producing such an arrangement.

The object is achieved by a printed circuit board with a circuit carrier zone in which a circuit carrier can be located. The circuit board has conductor strips that are directed toward a guide zone of the printed circuit board that borders the circuit carrier zone. Auxiliary conductor strips are located in the guide zone for connecting the conductor strips to contact pads located on the circuit carrier. The auxiliary conductor strips run substantially parallel to the outline of the circuit carrier zone. The auxiliary conductor strips run in such a way that first contact sections of the auxiliary conductor strips can be connected to ends of the conductor strips that lie in front of the guide zone by bonding links that do not intersect.

The object is further achieved by a printed circuit board assembly with a first printed circuit board that has a recess and with a second printed circuit board that is located in the recess and which has a circuit carrier zone in which a circuit carrier can be located. The first printed circuit board has conductor strips that are directed toward the second printed circuit board. In a guide zone that borders the circuit carrier zone, the second printed circuit board has auxiliary conductor strips for connecting the conductor strips to contact pads located on the circuit carrier. The auxiliary conductor strips run substantially parallel to the outline of the circuit carrier zone. The auxiliary conductor strips run in such a way that first contact sections of the auxiliary conductor strips can be connected to ends of the conductor strips that lie in front of the guide zone by bonding links that do not intersect.

Such a printed circuit board or printed circuit board assembly can be employed in an arrangement comprising a circuit carrier and a printed circuit board or a printed circuit board assembly, with this arrangement also fulfilling the function. With such an arrangement the circuit carrier is located in the circuit carrier zone. Second contact sections of the auxiliary conductor strips are connected to the contact pads via bonding links. The auxiliary conductor strips run in such a way that the bonding links do not intersect.

As the auxiliary conductor strips ensure that the conductor strips are electrically connected to the contact pads, the layout of the contact pads and lines on the circuit carrier do not have to be adapted to the layout of the conductor strips. It is consequently possible to employ the same circuit carrier with the same layout of its contact pads and lines for different layouts of the conductor strips. So if an arrangement comprising a circuit carrier and a printed circuit board or a printed circuit board assembly needs to be produced for a specific device, the following method can be used which also achieves the object:

The dimensions of the circuit carrier are produced independently of the particular design of the device. The contact pads and lines on the circuit carrier are also produced with an arrangement that is independent of the device and specified. The circuit carrier is in particular produced with no consideration given to the position of terminals of the device that are to be electrically connected to the circuit carrier. The layout of the conductor strips is designed such that the conductor strips electrically convey the terminals of the device to the guide zone in an economical manner. The layout of the conductor strips is therefore adapted to the particular design of the device and, especially, to the position of the terminals. The layout of the auxiliary conductor strips is adapted to the layout of the conductor strips, to the dimensions of the circuit carrier, and to the arrangement of the contact pads and lines of the circuit carrier for the purpose of connecting the conductor strips to the contact pads with the aid of bonding links.

Developing a new layout for contact pads and lines on a circuit carrier and hence for a circuit on the circuit carrier is a very cost-intensive and laborious process, whereas the cost of developing a layout of the conductor strips and auxiliary conductor strips is low by comparison. The arrangement is particularly economical and simple to manufacture as the invention allows the same, familiar circuit carrier to be used regardless of the design of the device for producing the arrangement to be installed in the device.

This applies in particular when different arrangements are to be manufactured in the same production line as no time is required for resetting component insertion or bonding machines and the same program can be used for fitting the circuit carrier with components.

There is also a saving on warehousing and logistics costs as the same type of circuit carriers with the same contact pad and line arrangement are used to produce assemblies for different types of devices.

Producing an assembly for a device which, compared to other devices, does not require some of the components scheduled for the circuit carrier is also economical and simple as it is possible to use the same circuit carrier which, however, is only partially fitted with components.

The quality of the newly developed assembly is very high as a familiar and hence thoroughly tested circuit carrier is employed for an assembly of a new device.

The dimensions of the circuit carrier and the layout of the contact pads and lines can be developed in such a way as to be optimally adapted to a specific first device. No, or only a few auxiliary conductor strips are required for the first device. However, the developed circuit carrier is used for further devices.

In order to simplify the routing of the conductor strips it is advantageous for the guide zone to surround the circuit carrier zone. However, the scope of the invention encompasses any type of design for the guide zone. For example the guide zone can be L-shaped and border two sides of the circuit carrier zone. Alternatively, the guide zone can form two strips that border opposite sides of the circuit carrier zone.

The printed circuit boards are preferably designed as flexible printed circuit boards.

The intersecting of electrical paths between the terminals and of the contact pads for routing the electrical paths is made possible by the bonding links since special auxiliary conductor strips can run at right angles to and under the bonding links.

Ends of conductor strips that lie in front of the guide zone will often be connected to first contact sections of auxiliary conductor strips by bonding links. A first conductor strip should be connected by a bonding link to the first contact section of a first auxiliary conductor strip when another auxiliary conductor strip is provided which is further away from the circuit carrier zone than the first auxiliary conductor strip and has to be routed past the first conductor strip. The other auxiliary conductor strip and the bonding link intersect without touching. The arrangement therefore includes double bonds: An electrical path has a bonding link in each case between the conductor strip and the auxiliary conductor strip and between the auxiliary conductor strip and the contact pad.

If this type of intersecting is not necessary, the end on the conductor strip that lies in front of the guide zone can border the first contact section of the auxiliary conductor strip. A bonding link is in this case superfluous.

The bonding links do not intersect, so that no short-circuits occur. So as to avoid their slackening and causing short-circuiting, the bonding links should not be too long. The auxiliary conductor strips preferably run in such a way that, given the specified distance between the outline of the circuit carrier zone and the auxiliary conductor strip, the ends of the conductor strips that lie in front of the guide zone are in each case basically as close as possible to the first contact section of the assigned auxiliary conductor strip. This means that a line linking an end of a conductor strip that lies in front of the guide zone and a first contact section of the assigned auxiliary conductor strip runs perpendicular to the course of the auxiliary conductor strip.

In order to prevent excessively long bonding links, it is advantageous for the auxiliary conductor strips to run in such a way that, given the specified distance between the outline of the circuit carrier zone and the auxiliary conductor strip, the contact pads are in each case basically as close as possible to the second contact section of the assigned auxiliary conductor strip.

It is within the scope of the invention to arrange at least one external component on the printed circuit board or on the first printed circuit board that is connected to at least one of the conductor strips or auxiliary conductor strips. An example of what can be achieved through this is the possibility of designing a smaller casing for the circuit carrier. This is particularly advantageous when the external component is very large. Such a component can be, for instance, a capacitor, a coil or a semiconductor.

Making provision for an external component is also advantageous in cases when the external component is especially heavy. Components are as a rule bonded to the circuit carrier whereas they can be soldered onto a printed circuit board; this means that particularly heavy components adhere worse on a circuit carrier than on a printed circuit board.

Furthermore, it is possible to use an arrangement comprising a circuit carrier and a printed circuit board or printed circuit board assembly with at least one external component for a device which, in contrast to other devices, requires an additional component besides the components on the circuit carrier. The arrangement can also be manufactured economically and simply for a device of this type because the additional component is attached as an external component to the printed circuit board instead of on the circuit carrier, thus making it unnecessary to develop a new layout of the contacts and lines of the circuit carrier.

For reasons of cost, in the case of an arrangement comprising a circuit carrier and a printed circuit board assembly the first printed circuit board is designed as an oil-proof flexible printed circuit board, whereas the second printed circuit board is preferably designed as a non-oil-proof and hence more economical flexible printed circuit board. Such an arrangement is possible if the first printed circuit board and the second printed circuit board are located on a supporting baseplate that is routed through an oil-proof casing in such a way that the bonding links and the second printed circuit board are located in the casing, whereas part of the first printed circuit board is located outside the casing.

Making provision for a second printed circuit board can also be advantageous in cases when the presence of a large number of terminals makes it particularly difficult to route the electrical paths. In this case the second printed circuit board can have at least two layers located one above the other in which the auxiliary conductor strips are located. In the case of a multi-layer printed circuit board the auxiliary conductor strips of the different layers can intersect without causing short-circuits, so that routing is easier to implement. As routing is limited to the second printed circuit board, the first printed circuit board can continue to have just one layer and consequently be economical.

The circuit carrier zone can be designed as a recess in the printed circuit board or is part of the printed circuit board. In the latter case it is possible to route special conductor strips below the circuit carrier zone.

BRIEF DESCRIPTION OF THE DRAWINGS

Exemplary embodiments of the invention are explained in more detail below with reference to the figures.

FIG. 2 presents a view of a second arrangement comprising a circuit carrier and a printed circuit board assembly with a first printed circuit board, a second printed circuit board, conductor strips, upper auxiliary conductor strips, lower auxiliary conductor strips, bonding links, contact pads, components, an external component, a casing, and lines.

DETAILED DESCRIPTION OF THE PREFERRED EMBODIMENTS

Figure 1:
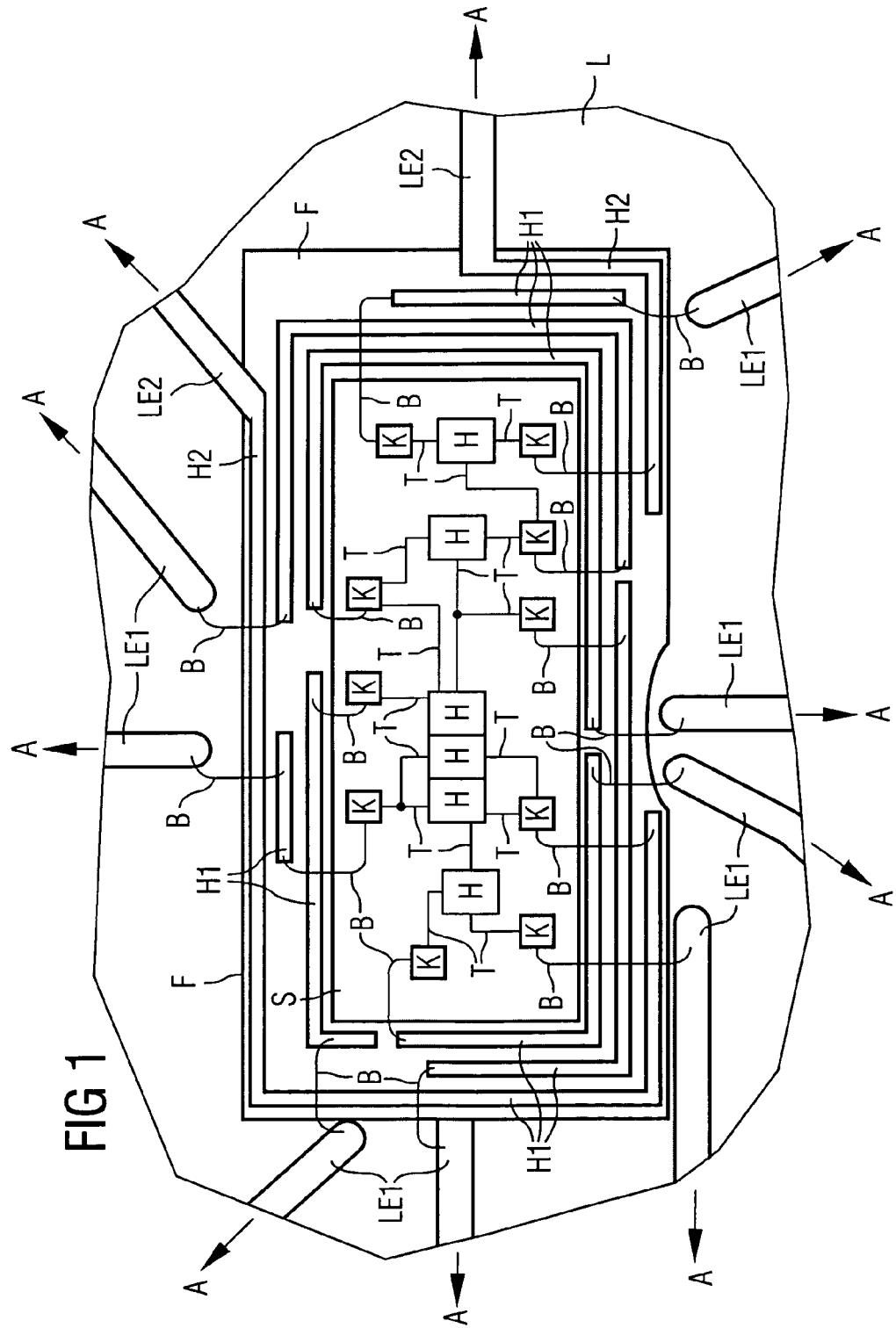
FIG. 1 presents a view of a first arrangement comprising a circuit carrier and a printed circuit board with first conductor strips, second conductor strips, first auxiliary conductor strips, second auxiliary conductor strips, bonding links, contact pads, components, and lines.

In a first exemplary embodiment, a first arrangement comprising a circuit carrier S and a printed circuit board L is provided for a first device with terminals A (see FIG. 1). Printed circuit board L has a circuit carrier zone in which circuit carrier S is located. The circuit carrier zone can be designed as a recess in printed circuit board L or is part of printed circuit board L.

Printed circuit board L consists of a base foil and a cover foil of polyimide. Between the base foil and cover foil is a conducting structured copper layer forming first conductor strips LE1, second conductor strips LE2, first auxiliary conductor strips H1, and second auxiliary conductor strips H2. Printed circuit board L is therefore a single-layer flexible printed circuit board.

Conductor strips LE1, LE2 are directed toward a guide zone F of printed circuit board L surrounding the circuit carrier zone.

First auxiliary conductor strips H1 and second auxiliary conductor strip H2 are located in guide zone F. These auxiliary conductor strips H1, H2 run substantially parallel to the outline of the circuit carrier zone. First contact sections of first auxiliary conductor strips H1 lie opposite the ends of assigned first conductor strips LE1 located in front of guide zone F and are connected to first conductor strips LE1 via bonding links B.

First contact sections of second auxiliary conductor strips H2 border the ends of second conductor strip LE2 that lie in front of guide zone F.

Second contact sections of auxiliary conductor strips H1, H2 lie opposite contact pads K of the circuit carriers S and are connected to contact pads K via bonding links B.

Contact pads K are connected to each other and to components H bonded to circuit carrier S with the aid of lines T located in circuit carrier S.

In a second exemplary embodiment a second arrangement on a circuit carrier S' and a printed circuit board assembly is provided for a second device with terminals A' (see FIG. 2).

The printed circuit board assembly has a first printed circuit board L1 and a second printed circuit board L2. First printed circuit board L1 has a recess in which the second printed circuit board L2 is located.

Second printed circuit board L2 has a circuit carrier zone in which circuit carrier S' is located.

First printed circuit board L1 is designed as a single-layer flexible printed circuit board and has conductor strips LE which are directed toward second printed circuit board L2. Second printed circuit board L2 is designed as a two-layer flexible printed circuit board. Upper auxiliary conductor strips HO are located in an upper layer of second printed circuit board L2, whereas lower auxiliary conductor strips HU are located in the lower layer of second printed circuit board L2. Auxiliary conductor strips HO, HU are located in a guide zone F' surrounding the circuit carrier zone. Auxiliary conductor strips HU, HO run substantially parallel to the outline of the circuit carrier zone. First contact sections of auxiliary conductor strips HU, HO are connected to ends of conductor strips LE that lie in front of guide zone F' via bonding links B' that do not intersect. Second contact sections of auxiliary conductor strips HU, HO lie opposite contact pads K' of circuit carrier S' and are connected to contact pads K' via bonding links B'.

Bonding links B', second printed circuit board L2, and circuit carrier S' are located in an oil-proof casing G'.

On circuit carrier S', components H' and lines T' are provided whose layout corresponds to that of components H, contact pads K, and lines T in the first exemplary embodiment.

First printed circuit board L1 and second printed circuit board L2 are securely bonded to a baseplate made of, for instance, aluminum (not shown).

An external component HA is located on first printed circuit board L1. External component HA is designed as a capacitor and is connected to two of conductor strips LE.

What is claimed is:

1. A printed circuit board comprising:
    a circuit carrier zone wherein a circuit carrier can be located,
    conductor strips that are directed toward a guide zone of the printed circuit board that borders the circuit carrier zone,
    auxiliary conductor strips located in the guide zone for connecting the conductor strips to contact pads located on the circuit carrier, wherein
    the auxiliary conductor strips run substantially parallel to the outline of the circuit carrier zone, and
    the auxiliary conductor strips run such that first contact sections of the auxiliary conductor strips can be connected to ends of the conductor strips that lie in front of the guide zone via non-intersecting bonding links, wherein at least one auxiliary conductor strip runs substantially parallel to at least a first and a second side defined by said outline.

2. A printed circuit board according to claim 1, wherein the auxiliary conductor strips run in such a way that, given the specified distance between the outline of the circuit carrier zone and the auxiliary conductor strip, the ends of the conductor strips that lie in front of the guide zone are in each case basically as close as possible to the first contact section of the assigned auxiliary conductor strip.

3. A printed circuit board according to claim 1, wherein the first contact sections of the auxiliary conductor strips form ends of the auxiliary conductor strips.

4. A printed circuit board according to claim 1, wherein the printed circuit board has a recess, said recess adapted to receive a second printed circuit board having a circuit carrier zone in which a circuit carrier can be located.

5. A printed circuit board according to claim 1, wherein the auxiliary conductor strips are adapted to be located in a second printed circuit board having at least two layers located one above the other.

6. A printed circuit according to claim 4, wherein
    the auxiliary conductor strips run such that, given the specified distance between the outline of the circuit carrier zone and the auxiliary conductor strip, the ends of the conductor strips that lie in front of the guide zone are in each case basically as close as possible to the first contact section of the assigned auxiliary conductor strip.

7. A printed circuit board according to claim 6, wherein the first contact sections of the auxiliary conductor strips form ends of the auxiliary conductor strips.

8. A printed circuit board according to claim 1, wherein the auxiliary conductor strips have second contact sections connected to the contact pads via bonding links.

9. The circuit board according to claim 8, wherein
the auxiliary conductor strips run such that, given the specified distance between the outline of the circuit carrier zone and the auxiliary conductor strip, the contact pads are in each case basically as close as possible to the second contact section of the assigned auxiliary conductor strip.

10. The circuit board according to claim 8, wherein
the end of a conductor strip that lies in front of the guide zone is connected by a bonding link to the first contact section of a first auxiliary conductor strip.

11. The circuit board according to claim 8, wherein
the end of a conductor strip that lies in front of the guide zone borders the first contact section of a second auxiliary conductor strip.

12. The circuit board according to claim 8, wherein
at least one external component is located on the printed circuit board.

13. The circuit board according to claim 8, wherein
the printed circuit board is an oil-proof flexible printed circuit board and adapted to be located on a baseplate.

14. A printed circuit board according to claim 1, wherein at least one auxiliary conductor strip partially surrounds said circuit carrier.

* * * * *